(12) United States Patent
Lee

(10) Patent No.: US 12,207,494 B2
(45) Date of Patent: Jan. 21, 2025

(54) CIRCULAR POLARIZING PLATE

(71) Applicant: LG CHEM, LTD., Seoul (KR)

(72) Inventor: Yeon Keun Lee, Daejeon (KR)

(73) Assignee: LG CHEM, LTD., Seoul (KR)

( * ) Notice: Subject to any disclaimer, the term of this patent is extended or adjusted under 35 U.S.C. 154(b) by 489 days.

(21) Appl. No.: 17/764,067

(22) PCT Filed: Oct. 27, 2020

(86) PCT No.: PCT/KR2020/014702
§ 371 (c)(1),
(2) Date: Mar. 25, 2022

(87) PCT Pub. No.: WO2021/085973
PCT Pub. Date: May 6, 2021

(65) Prior Publication Data
US 2022/0359850 A1    Nov. 10, 2022

(30) Foreign Application Priority Data

Nov. 1, 2019 (KR) .................. 10-2019-0138749

(51) Int. Cl.
*G02B 1/11* (2015.01)
*G02B 5/30* (2006.01)
*H10K 50/86* (2023.01)

(52) U.S. Cl.
CPC .............. *H10K 50/86* (2023.02); *G02B 1/11* (2013.01); *G02B 5/3033* (2013.01); *G02B 5/3083* (2013.01)

(58) Field of Classification Search
CPC ........ H10K 50/86; G02B 1/11; G02B 5/3033; G02B 5/3083

USPC .................. 359/483.01, 487.01, 489.07
See application file for complete search history.

(56) References Cited

U.S. PATENT DOCUMENTS

| | | | | |
|---|---|---|---|---|
| 9,201,183 | B2* | 12/2015 | Yoon ............... | G02F 1/13363 |
| 9,459,389 | B2* | 10/2016 | Shimizu ............ | G02B 5/3041 |
| 10,209,416 | B2* | 2/2019 | Jeon ................ | G02B 5/3041 |
| 10,520,656 | B2* | 12/2019 | Murashige ......... | H10K 50/86 |
| 10,705,385 | B2* | 7/2020 | Hashimoto ........ | G02F 1/1335 |
| 11,985,847 | B2* | 5/2024 | Lee ................. | H10K 59/8791 |
| 12,010,900 | B2* | 6/2024 | Lee ................. | G02B 1/113 |

(Continued)

FOREIGN PATENT DOCUMENTS

| | | |
|---|---|---|
| CN | 101315431 A | 12/2008 |
| CN | 109716183 A | 5/2019 |

(Continued)

OTHER PUBLICATIONS

Extended European Search Report issued in European Patent Application No. 20881015.0 on Dec. 2, 2022, 5 pages.

(Continued)

*Primary Examiner* — Ricky D Shafer
(74) *Attorney, Agent, or Firm* — ROTHWELL, FIGG, ERNST & MANBECK, P.C.

(57) ABSTRACT

The present application relates to a circularly polarizing plate. The present application can provide a circularly polarizing plate which can improve a reflection color sense by using a retardation film having flat dispersion characteristics. In addition, the present application can provide an OLED device comprising the circularly polarizing plate.

16 Claims, 5 Drawing Sheets

(56) References Cited

U.S. PATENT DOCUMENTS

| | | | |
|---|---|---|---|
| 2009/0058250 A1* | 3/2009 | Sin | H01J 29/898 |
| | | | 313/112 |
| 2018/0045872 A1* | 2/2018 | Kitagawa | G02B 5/30 |
| 2018/0284332 A1* | 10/2018 | Murashige | G02B 5/3083 |
| 2018/0348419 A1* | 12/2018 | Iida | H10K 59/00 |
| 2019/0072701 A1* | 3/2019 | Murashige | G02B 5/3083 |
| 2020/0043993 A1 | 2/2020 | Lee et al. | |
| 2020/0136094 A1* | 4/2020 | Yoon | C09D 137/00 |
| 2020/0212366 A1 | 7/2020 | Kim et al. | |
| 2020/0411802 A1 | 12/2020 | Fujita et al. | |
| 2021/0005848 A1 | 1/2021 | Kim et al. | |
| 2021/0325590 A1 | 10/2021 | Lee et al. | |

FOREIGN PATENT DOCUMENTS

| | | |
|---|---|---|
| CN | 110235029 A | 9/2019 |
| EP | 1697131 B1 | 6/2012 |
| JP | H08-321381 A | 12/1996 |
| JP | 2005-283872 A | 10/2005 |
| JP | 2005-316350 A | 11/2005 |
| JP | 2007-233215 A | 9/2007 |
| JP | 2014-092611 A | 5/2014 |
| JP | 2016-136181 A | 7/2016 |
| JP | 2017-165941 A | 9/2017 |
| KR | 10-2008-0104481 A | 12/2008 |
| KR | 10-2009-0023044 A | 3/2009 |
| KR | 10-2016-0091226 A | 2/2016 |
| KR | 10-2018-0107002 A | 10/2018 |
| KR | 20190120927 A | 10/2019 |
| KR | 10-2020-0050903 A | 5/2020 |
| KR | 10-2020-0126492 A | 11/2020 |
| KR | 10-2021-0028876 A | 3/2021 |
| TW | 201928422 A | 7/2019 |
| WO | 2019/124347 A1 | 6/2019 |

OTHER PUBLICATIONS

International Search Report issued for International Application No. PCT/KR2020/014702 on Jan. 27, 2021, 5 pages.

* cited by examiner

[Figure 1]
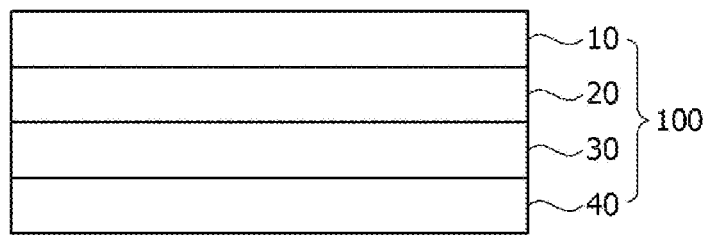

[Figure 2(a)]
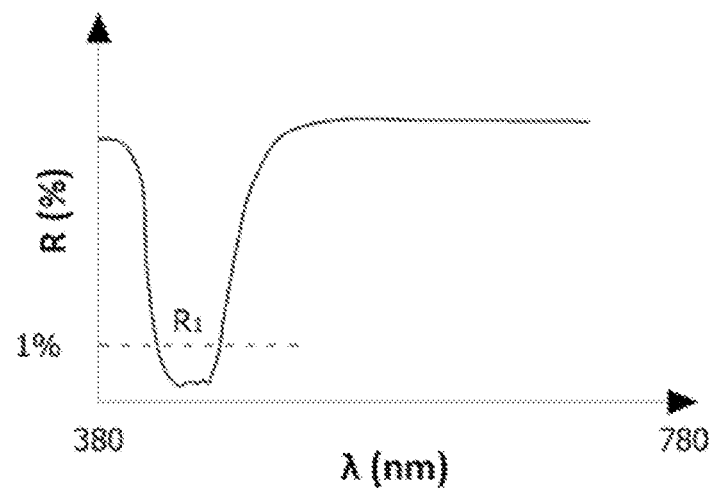
[Figure 2(b)]
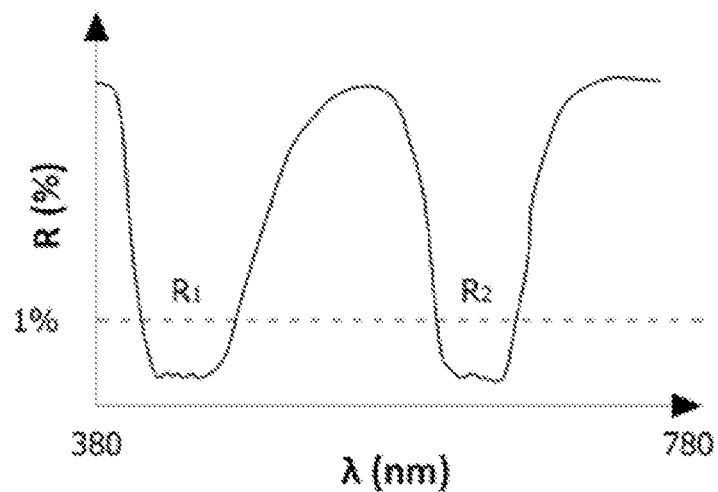

[Figure 3]
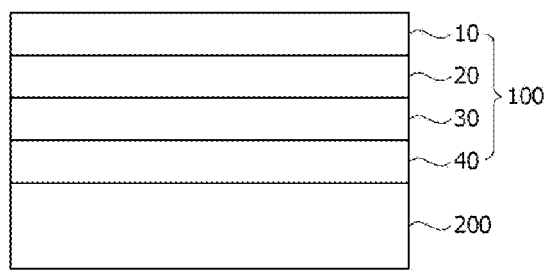
[Figure 4]
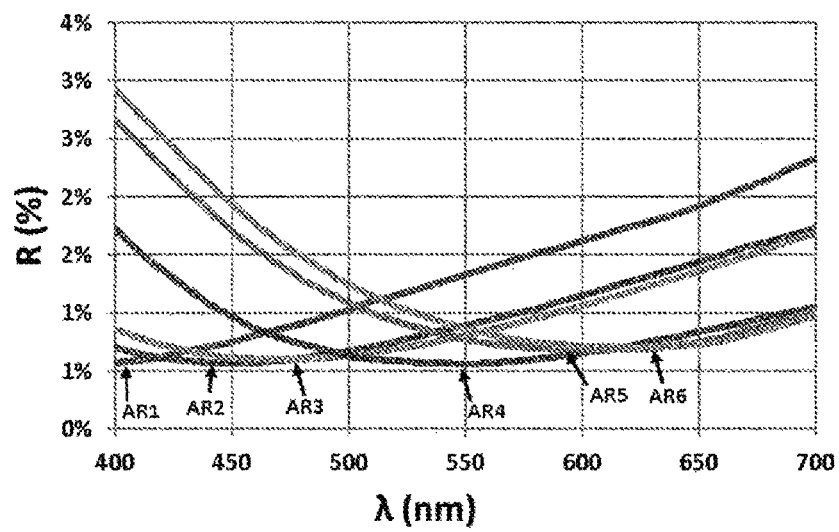

[Figure 5]
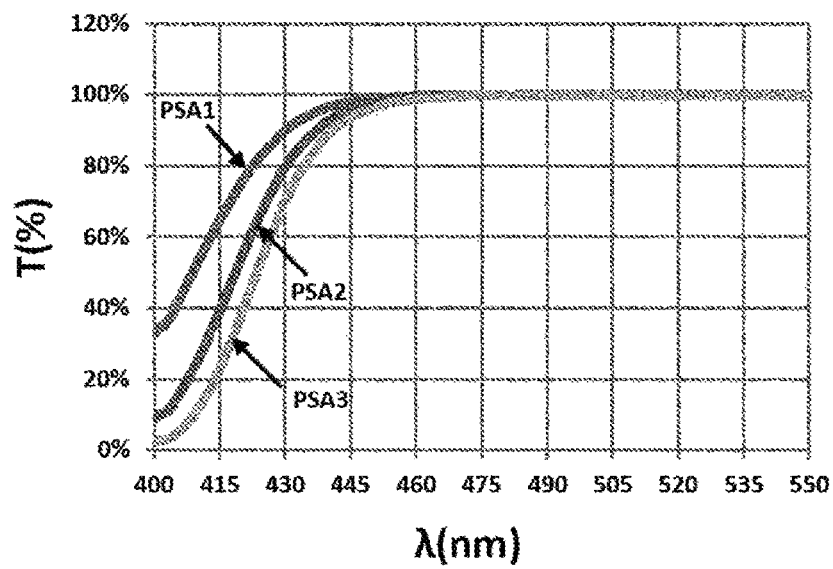
[Figure 6]
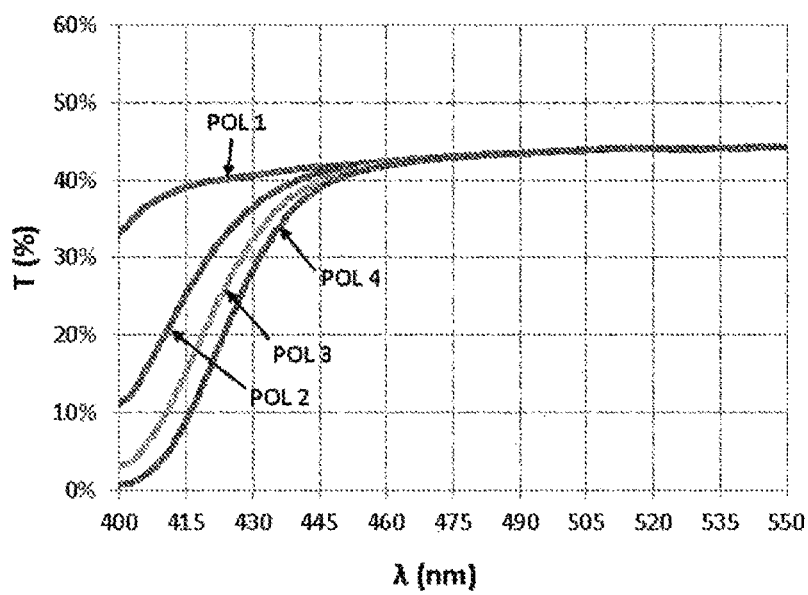

[Figure 7]
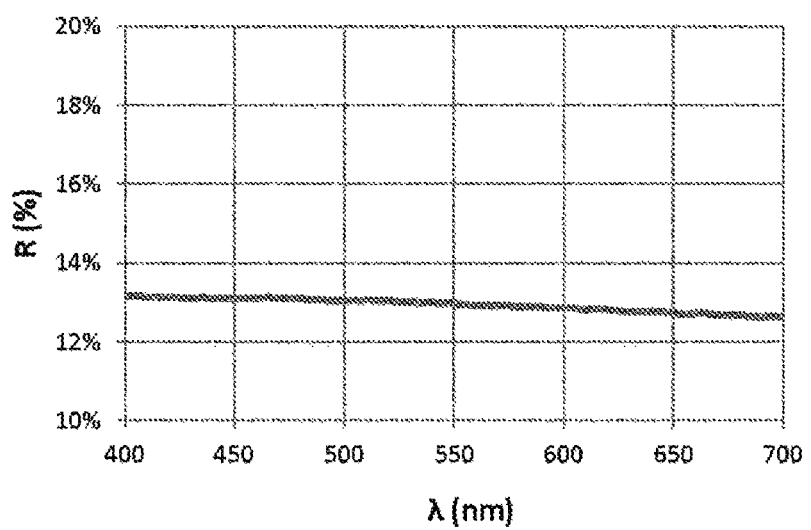

CIRCULAR POLARIZING PLATE

This application is a 35 U.S.C. 371 National Phase Entry Application from PCT/KR2020/014702 filed on Oct. 27, 2020, which claims the benefit of priority based on Korean Patent Application No. 10-2019-0138749 filed on Nov. 1, 2019, the disclosures of which are incorporated herein by reference in their entirety.

TECHNICAL FIELD

This application relates to a circularly polarizing plate.

BACKGROUND OF THE INVENTION

So-called circularly polarizing plates, which basically comprise polarizers and retardation films, can be used to lower surface reflection in the off state of OLED panels. For example, Patent Document 1 discloses a method of arranging a circularly polarizing plate toward a transparent electrode in an organic light emitting device. When the retardation film used for the circularly polarizing plate has a reverse dispersion property, it has a neutral reflection color sense to be most excellent, but is very expensive in terms of material properties (Patent Document 1: (Japanese Laid-Open Patent Publication No. H8-321381).

BRIEF DESCRIPTION OF THE INVENTION

The present application provides a circularly polarizing plate capable of improving a reflection color sense by using a retardation film having flat dispersion characteristics, and an OLED device comprising the circularly polarizing plate.

The present application relates to a circularly polarizing plate. FIG. 1 illustratively shows a circularly polarizing plate of the present application. As shown in FIG. 1, the circularly polarizing plate (100) of the present application may comprise an antireflection film (10), a polarizer (20), a retardation film (30) and a pressure-sensitive adhesive layer (40) sequentially. The retardation film may have a flat dispersion characteristic. The antireflection film for light having a wavelength of 550 nm may have reflectance of 2.0% or less. The antireflection film may have reflection colors satisfying $L^*a^*b^*$ color coordinate criterion $b^*>0$. The circularly polarizing plate may have transmittance of more than 30% for light having a wavelength of 430 nm.

Through such a circularly polarizing plate, the present application can improve the reflection color sense even when using a retardation film having flat dispersion characteristics. Hereinafter, the circularly polarizing plate of the present application will be described in detail.

DETAILED DESCRIPTION OF THE INVENTION

The reflectance of the antireflection film may be adjusted within a range such that the reflectance measured in a state where the circularly polarizing plate is attached to an OLED panel as described below is about 1.4% or less. The reflectance of the antireflection film for light having a wavelength of 550 nm may be 2.0% or less, and specifically may be 1.9% or less, 1.8% or less, 1.7% or less, 1.6% or less, 1.5% or less, 1.4% or less, or 1.3% or less. The lower limit of the reflectance of the antireflection film for light having a wavelength of 550 nm may be, for example, 0.6% or more or 0.7% or more.

The transmittance of the antireflection film for light having a wavelength of 380 nm to 780 nm may be 90% or more, or 95% or more. The haze of the antireflection film may be 1% or less. The lower limit of the haze of the antireflection film is not particularly limited, but may be, for example, 0.01% or more.

The reflection colors of the antireflection film may satisfy $L^*a^*b^*$ color coordinate criterion $b^*>0$ determined according to the method defined in CIE 1976. In addition, the reflection colors of the antireflection film may satisfy $a^*>0$ and $L^*>0$ based on $L^*a^*b^*$ color coordinate determined according to the method defined in CIE 1976. The a* may be specifically 0.5 or more, 1.0 or more, 1.5 or more, or 2.0 or more, and the upper limit thereof may be, for example, 5 or less. The b* may be specifically 0.05 or more, 0.1 or more, 0.5 or more, 1.0 or more, 2.0 or more, or 3.0 or more, and the upper limit thereof may be, for example, 10 or less. Meanwhile, the reflection colors of the antireflection film may satisfy $L^*a^*b^*$ color coordinate criterion $a^*<b^*$ or $a^*>b^*$ determined according to the method defined in CIE 1976. In one example, when the reflection colors of the antireflection film satisfy $a^*>b^*$, it may be more advantageous in improving the reflection color sense as compared to a case where $a^*<b^*$ is satisfied. In addition, the L* may specifically satisfy $0.5<L^*<13$. The L* may be specifically 2.0 or more, 4.0 or more, 6.0 or more, or 7.0 or more. Through the use of such an antireflection film, it may be more advantageous to improve the reflection color sense by using a retardation film having flat dispersion characteristics.

The antireflection film may have the lowest reflection wavelength of 500 nm or less, 490 nm or less, 485 nm or less, 480 nm or less, 475 nm or less, or 470 nm or less. In this specification, the lowest reflection wavelength may mean a wavelength at a point where the reflectance is lowest in a reflectance spectrum of the antireflection film for light wavelengths. The lowest reflection wavelength of the antireflection film may be, for example, 380 nm or more. The lowest reflectance of the antireflection film may be 1.0% or less. In this specification, the lowest reflectance may mean reflectance at a point where the reflectance is lowest in a reflectance spectrum of the antireflection film for wavelengths.

In the antireflection film, the reflectance spectrum for wavelengths may exhibit a U-shaped graph. FIG. 2(*a*) illustratively shows a U-shaped graph, and FIG. 2(*b*) illustratively shows a W-shaped graph. However, FIG. 2 is a diagram for illustratively describing the U-shaped graph, and the scope of the present application is not limited to FIG. 2. The antireflection film may have a reflection band showing the lowest reflectance at a wavelength in the range of 380 nm to 780 nm, for example, one wavelength band (R1 region in FIG. 2(*a*)) that the reflectance is 1% or less. Such a U-shaped graph may be a concept distinguished from the W-shaped graph that the reflection band showing the lowest reflectance at a wavelength in the range of 380 nm to 780 nm is two regions (R1 and R2 in FIG. 2(*b*)). Through the use of such an antireflection film, it may be more advantageous to improve the reflection color sense by using a retardation film having flat dispersion characteristics.

When the optical properties of the antireflection film are within the above range, the material may be appropriately selected. For example, the antireflection film may comprise a low refractive layer. It is known to adjust the optical properties of the antireflection film within the above range. For example, the lowest reflection wavelength of the antireflection film tends to shift to longer wavelengths as the thickness of the low refractive layer becomes thicker, and to shift to short wavelengths as the thickness of the low refractive layer becomes thinner. In addition, the lowest reflectance of the antireflection film may be determined by a low refractive index material. For example, the lowest reflectance of the antireflection film tends to decrease as the refractive index of the low refractive material decreases.

The low refractive layer may comprise a low refractive material. In one example, the low refractive material may be low refractive inorganic particles. The refractive index of the low refractive inorganic particles for light having a wavelength of 550 nm may be, for example, 1.5 or less, 1.45 or less, or 1.40 or less. The lower limit of the refractive index may be, for example, 1.0 or more, 1.1 or more, 1.2 or more, or 1.3 or more.

In one example, the low refractive inorganic particles may be silica-based particles. The silica-based particles may be exemplified by, for example, hollow silica, mesoporous silica, and the like. In another example, as the low refractive inorganic particles, magnesium fluoride ($MgF_2$) may be used.

In one example, the low refractive inorganic particles may be nano-sized particles. The low refractive inorganic particles may have, for example, an average particle diameter in a range of 10 nm to 700 nm, 10 nm to 500 nm, 10 nm to 300 nm, 10 nm to 200 nm or 10 nm to 100 nm.

The thickness of the low refractive layer may be appropriately adjusted in consideration of the purpose of the present application. The thickness of the low refractive layer may be, for example, in a range of 10 nm to 500 nm, 10 nm to 300 nm, 10 nm to 200 nm, 50 nm to 200 nm or 100 nm to 200 nm. As described above, the lowest reflection wavelength of the antireflection film can be adjusted according to the thickness of the low refractive layer, and thus the thickness of the low refraction layer can be appropriately adjusted within the above range in consideration of the desired lowest reflection wavelength.

The low refractive layer may further comprise a binder resin. The low refractive inorganic particles may be present in a state dispersed in the binder resin.

The low refractive layer may comprise 30 to 600 parts by weight of the low refractive inorganic particles relative to 100 parts by weight of the binder resin. Specifically, the low refractive inorganic particles may be included in the range of 30 to 500 parts by weight, 30 to 400 parts by weight, 30 to 300 parts by weight, 30 to 200 parts by weight or 100 to 200 parts by weight relative to 100 parts by weight of the binder resin. When the content of the low refractive inorganic particles is excessive, the reflectance may be increased, and surface irregularities may be excessively generated to reduce surface properties such as scratch resistance and an antifouling property.

The binder resin may be, for example, a photopolymerizable compound. Specifically, the photopolymerizable compound may comprise a monomer or oligomer containing a (meth)acrylate group or a vinyl group. More specifically, the photopolymerizable compound may comprise a monomer or oligomer containing one or more, two or more, or three or more (meth)acrylate groups or vinyl groups.

A specific example of the monomer or oligomer containing a (meth)acrylate group may include pentaerythritol tri(meth)acrylate, pentaerythritol tetra(meth)acrylate, dipentaerythritol penta(meth)acrylate, dipentaerythritol hexa(meth)acrylate, tripentaerythritol hepta(meth)acrylate, trimethylolpropane tri(meth)acrylate, trimethylolpropane polyethoxy tri(meth)acrylate, trimethylolpropane trimethacrylate, ethylene glycol dimethacrylate, butanediol dimethacrylate, butyl methacrylate or a mixture of two or more thereof, or a urethane-modified acrylate oligomer, an epoxide acrylate oligomer, an ether acrylate oligomer, a dendritic acrylate oligomer, or a mixture of two or more thereof. At this time, the molecular weight of the oligomer is preferably in a range of 1,000 to 10,000.

A specific example of the monomer or oligomer containing a vinyl group may include divinylbenzene, styrene or paramethylstyrene.

On the other hand, the photopolymerizable compound may further comprise a fluorine (meth)acrylate-based monomer or oligomer in addition to the above-described monomer or oligomer. When it further comprises the fluorine (meth)acrylate-based monomer or oligomer, the weight ratio of the fluorine (meth)acrylate-based monomer or oligomer to the monomer or oligomer containing a (meth)acrylate group or a vinyl group may be in a range of 0.1% to 10%.

The antireflection film may further comprise a base layer, and the low refractive layer may be formed on one side of the base layer.

The base layer may comprise a light transmissive resin. Thus, the base layer may be a light transmissive base layer. For example, the base layer may have transmittance of 90% or more for light having a wavelength of 380 nm to 780 nm. For example, the base layer may have haze of 1% or less for light having a wavelength of 380 nm to 780 nm. Through the use of such a base layer, it may be more advantageous to provide an antireflection film that can lower the reflectance while maintaining high transmittance.

The base layer may comprise one or more selected from the group consisting of a triacetyl cellulose (TAC) film, a cycloolefin polymer film, a poly(meth)acrylate-based film, a polycarbonate film, a polynorbornene film and a polyester film. The thickness of the base layer may be in a range of 10 μm to 300 μm in consideration of productivity or the like, but is not limited thereto.

The low refractive layer may be produced by coating a composition for forming a low refractive layer on a base layer and curing it. The composition for forming a low refractive layer may comprise the low refractive inorganic particles, and moreover, may further comprise the binder resin. As described below, when a hard coating layer is formed on the base layer, the low refractive layer may be formed by coating the composition for forming a low refractive layer on the hard coating layer and curing it.

A method of coating the composition for forming a low refractive layer is not particularly limited, which may be performed by a known coating method such as spin coating, bar coating, roll coating, gravure coating or blade coating.

A method of curing the composition for forming a low refractive layer is not particularly limited, which may be performed by, for example, irradiation of light or application of heat. The photo-curing of the composition for forming a low refractive layer may be performed by irradiating it with ultraviolet rays having a wavelength of 200 nm to 400 nm or visible light. In addition, the exposure amount upon light irradiation may be in a range of 100 mJ/cm$^2$ to 4,000 mJ/cm$^2$. The exposure time is not specifically limited, which may be changed suitably according to the exposure apparatus used, wavelength of irradiation light, or exposure amount.

The antireflection film may further comprise a hard coating layer. The hard coating layer may be present between the base layer and the low refractive layer. The hard coating layer may improve the hardness of the antireflection film. Through this, the antireflection film may be used as an optical film, that is, a window film, positioned at the outermost portion of the display device.

The refractive index range of the hard coating layer may be appropriately selected within a range that does not impair the purpose of the present application. For example, the hard coating layer may have a refractive index of, for example, 1.5 or less, 1.40 or 1.30 or less for light having a wavelength of 550 nm. The lower limit of the refractive index may be, for example, 1.0 or more, 1.1 or more, or 1.2 or more.

As the hard coating layer, a conventionally known hard coating layer can be used without great limitation. The hard coating layer may comprise, for example, a photocurable resin. The photocurable resin may be a light transmissive resin. The photocurable resin included in the hard coat layer is a polymer of a photocurable compound that may cause a polymerization reaction when light such as ultraviolet rays is irradiated, which may be conventional in the art. Specifically, the photocurable resin may comprise one or more selected from the reactive acrylate oligomer group consisting of a urethane acrylate oligomer, an epoxide acrylate oligomer, a polyester acrylate and a polyether acrylate; and the multifunctional acrylate monomer group consisting of dipentaerythritol hexaacrylate, dipentaerythritol hydroxy pentaacrylate, pentaerythritol tetraacrylate, pentaerythritol triacrylate, trimethylene propyl triacrylate, propoxylated glycerol triacrylate, trimethylpropane ethoxy triacrylate, 1,6-hexanediol diacrylate, propoxylated glycerol triacrylate, tripropylene glycol diacrylate and ethylene glycol diacrylate.

The hard coat layer may further comprise organic or inorganic particulates dispersed in the photocurable resin. A specific example of the organic or inorganic particulates included in the hard coating layer is not limited, but for example, the organic or inorganic particulates may be one or more organic particulates selected from the group consisting of an acrylic resin, a styrene resin, an epoxide resin and a nylon resin, or one or more inorganic particulates selected from the group consisting of silicon oxide, titanium dioxide, indium oxide, tin oxide, zirconium oxide and zinc oxide. The particle diameter of the organic or inorganic particulates is not particularly limited, but for example, the organic particulates may have a particle diameter of 1 to 10 μm, and the inorganic particulates may have a particle diameter of 1 nm to 500 nm or 1 nm to 300 nm. The particle diameter of the organic or inorganic particulates may be defined as a volume average particle diameter.

The thickness of the hard coating layer may be, for example, in a range of 0.1 μm to 100 μm. The pencil hardness of the antireflection film to which the hard coating layer is applied may be, for example, 2 H or more or 4 H or more. Within this range, even when the antireflection film is used as the outermost window film of the display device, it may be advantageous to protect a transparent display element from the outside.

The hard coat layer may be produced by, for example, coating a composition for forming a hard coat layer on a base layer and curing it. The composition for forming a hard coat layer may comprise the photocurable resin, and may further comprise the organic or inorganic particulates, if necessary.

A method of curing the composition for forming a hard coating layer is not particularly limited, which may be performed by, for example, irradiation of light or application of heat. The photo-curing of the composition for forming a hard coating layer may be performed by irradiating it with ultraviolet rays having a wavelength of 200 nm to 400 nm or visible light. In addition, the exposure amount upon light irradiation may be in a range of 100 mJ/cm$^2$ to 4,000 mJ/cm$^2$. The exposure time is not specifically limited, which may be changed suitably according to the exposure apparatus used, wavelength of irradiation light, or exposure amount.

The composition for forming a low refractive layer or the composition for forming a hard coating layer may further comprise a solvent. The solvent may be an organic solvent. As the organic solvent, a hydrocarbon-based, halogenated hydrocarbon-based or ether-based solvent may be used. An example of the hydrocarbon-based solvent may include a solvent of pentane, hexane, heptane, cyclohexane, n-decane, n-dodecane, benzene, toluene, xylene, methoxy benzene or the like. An example of the halogenated hydrocarbon-based solvent may include a solvent of carbon tetrachloride, chloroform, 1,2-dichloroethane, dichloromethane, chlorobenzene or the like. An example of the ether-based solvent may include a solvent of tetrahydrofuran, dioxane, propylene glycol mono methyl ether acetate or the like.

The composition for forming a low refractive layer or the composition for forming a hard coating layer may further comprise any additive. Such an additive may be exemplified by, for example, a curing agent or catalyst or an initiator, such as a radical initiator or a cationic initiator, to assist in curing a curable resin, a thixotropy-imparting agent, a leveling agent, an antistatic agent, an antifoaming agent, an antioxidant, a radical generating material, organic and inorganic pigments or dyes, a dispersant, various fillers such as thermally conductive fillers or insulating fillers, a functional polymer or a light stabilizer, and the like, but is not limited thereto.

In this specification, the term polarizer means a film, sheet or element having a polarization function. The polarizer is a functional element capable of extracting light that vibrates in one direction from incident light that vibrates in various directions.

In this specification, the terms, polarizer and polarizing plate, refer to objects that are distinguished from each other. The term polarizer means a film, sheet or element itself having a polarizing function, and the term polarizing plate means an object comprising the polarizer and another element laminated on one or both sides of the polarizer. Here, another element may be exemplified by a protective film of a polarizer, an antireflection film, a retardation film, a pressure-sensitive adhesive layer, an adhesive layer, a surface treatment layer, and the like, but is not limited thereto. According to the circularly polarizing plate of the present application, it may or may not comprise a protective film attached to one side or both sides of the polarizer. The antireflection film and/or the retardation film may act as a protective base material of the polarizer even if not including a separate protective film attached to one side or both sides of the polarizer.

In the present application, as the polarizer, an absorptive linear polarizer can be used. As such a polarizer, a PVA (poly(vinyl alcohol)) polarizer is known. Basically, in the present application, a known polarizer can be used as the polarizer. In one example, as the known PVA (poly(vinyl alcohol)) polarizer, a polarizer having the following characteristics can be applied.

The transmittance of the polarizer for light having a wavelength of 550 nm may be in a range of 40% to 50%. The transmittance may specifically be in the range of 42% to 43% or 43.5% to 44.5%. The transmittance may mean single transmittance of the polarizer for light having a wavelength of 550 nm. The single transmittance of the polarizer can be measured using, for example, a spectrometer (V7100, manufactured by Jasco). For example, after the air is set to the base line in a state where the polarizer sample (not including the upper and lower protective films) is placed on the apparatus and each transmittance is measured in a state in which the axis of the polarizer sample is vertically and horizontally aligned with the axis of the reference polarizer, the single transmittance can be calculated.

In general, the PVA (poly(vinyl alcohol))-based absorptive linear polarizer exhibits the above single transmittance, and in the present application, such a PVA-based absorptive linear polarizer can be applied, but the kind of the polarizer that can be applied is not limited to the above, as long as it exhibits the above single transmittance.

The PVA-based polarizer may generally comprise a PVA film or sheet and an anisotropic absorbent material, such as a dichroic dye or iodine, adsorbed and oriented on the PVA film or sheet.

The PVA film or sheet can be obtained, for example, by gelling polyvinyl acetate. The polyvinyl acetate can be exemplified by a homopolymer of vinyl acetate; and a copolymer of vinyl acetate and other monomers, and the like. Here, the other monomers copolymerized with vinyl acetate can be exemplified by one or two or more of an unsaturated carboxylic acid compound, an olefinic compound, a vinyl ether compound, an unsaturated sulfonic acid compound and an acrylamide compound having an ammonium group, and the like.

The polyvinyl acetate has generally a gelation degree of about 85 mol % to about 100 mol % or 98 mol % to 100 mol % or so. The polyvinyl alcohol in the linear polarizer may have generally a polymerization degree of about 1,000 to about 10,000 or about 1,500 to about 5,000.

The PVA polarizer is produced via a dyeing process and a stretching process on the PVA film or sheet. If necessary, the production process of the polarizer may further comprise a swelling, crosslinking, cleaning and/or drying process.

Here, for example, the dyeing process is a process for adsorbing iodine, which is an anisotropic absorbent material, on a PVA film or sheet, and may be performed by immersing the PVA film or sheet in a treatment tank containing iodine and potassium iodide, where in this procedure, the single transmittance can be controlled by a method of controlling the concentration of iodine and potassium iodide in the treatment tank.

In the dyeing process, the PVA film or sheet is immersed in a dyeing solution or a crosslinking solution containing an iodide such as iodine ($I_2$) or KI and/or a boric acid compound (boric acid or a borate) or the like, where in this procedure, the anisotropic absorbent material such as iodine is adsorbed on the PVA film or sheet. Accordingly, in the procedure, the kind or amount of the anisotropic absorbent material adsorbed on the polarizer is determined depending on the concentration of the compound in the dyeing solution, whereby the absorption rate and transmittance of the polarizer for light having a specific wavelength can be determined.

For example, a species of the iodine compound that may be present in the dyeing solution may be $I^-$, $I_2$, $I_3^-$ or $I_5^-$, and the like derived from an iodide ($M+I^-$) and iodine ($I_2$). Among these compounds, $I^-$ has a light absorption wavelength range of about 190 nm to 260 nm and its effect on the color sense is not significant, $I_2$ has a light absorption wavelength range of about 400 nm to 500 nm and its color sense is mainly red, $I_3^-$ has a light absorption wavelength range of about 250 nm to 400 nm and its color sense is mainly yellow, $I_5^-$ of the linear structure has no observed absorption wavelength range and its effect on the color sense is not significant, and $I_5^-$ of the curved structure has a light absorption wavelength range of about 500 nm to 900 nm and its color sense is mainly blue.

The retardation film may have flat dispersion characteristics. In this specification, the flat dispersion characteristic may mean a characteristic in which a retardation value is constant as the wavelength increases. In one example, the flat dispersion characteristic may mean that the R (450)/R (550) value of the retardation film is 0.99 to 1.01. Also, according to the flat dispersion characteristic, the R (650)/R (550) value of the retardation film may be 0.99 to 1.01. Here, R (λ) may mean an in-plane retardation value for light having a wavelength of λ nm. The retardation film having flat dispersion characteristics has an advantage of being able to obtain the product marketed at low cost compared with the retardation film having reverse dispersion characteristics. In addition, the retardation film having flat dispersion characteristics is also advantageous in a process yield since no additional coating process is required.

In this specification, the in-plane retardation value may be calculated according to Equation 1 below.

$$Rin = d \times (nx - ny) \qquad \text{[Equation 9]}$$

In Equation 1, Rin is in-plane retardation, nx and ny are an x-axis direction refractive index and a y-axis direction refractive index of a retardation film, respectively, and d is the thickness of the retardation film. Such definitions may apply equally herein, unless otherwise specified. Here, the x-axis direction may mean the slow axis direction on the surface of the retardation film, the y-axis direction may mean a planar direction (fast axis direction) perpendicular to the x-axis, and the z-axis direction may mean the direction of the normal of the plane formed by the x-axis and the y-axis, for example, the thickness direction of the retardation film. In this specification, the slow axis may mean an axis parallel to the direction in which the refractive index is highest based on the plane direction of the retardation film. Unless otherwise specified while referring to the refractive index herein, the refractive index is a refractive index for light having a wavelength of about 550 nm.

The in-plane retardation value of the retardation film for light having a wavelength of 550 nm may be in a range of 130 nm or more to 144 nm or less. The in-plane retardation value of the retardation film for light having a wavelength of 550 nm may be specifically 132.5 nm or more, 135 nm or more, 137.5 nm or more, or 140 nm or more. Within this range, it may be suitable for improving reflective visual appreciation using a flat dispersion retardation film.

A method of adjusting an in-plane retardation value of a retardation film is well-known. In one example, when the retardation film is a polymer stretched film, the in-plane retardation value may be adjusted by adjusting the material, thickness, and draw ratio of the polymer film. In another example, when the retardation film is a liquid crystal polymerization film, the in-plane retardation value may be adjusted by adjusting the thickness of the liquid crystal layer, the birefringence value of the liquid crystal, and the like.

The angle formed by the slow axis of the retardation film and the absorption axis of the polarizer may be in a range of 35 degrees to 55 degrees. The angle may be specifically 35 degrees or more, 37 degrees or more, 39 degrees or more, and may be 55 degrees or less, 50 degrees or less, 47 degrees or less, or 46 degrees or less. The angle may be more specifically in the range of 37 degrees to 43 degrees or in the range of 44 degrees to 46 degrees. Through this, it is possible to improve the reflective visual appreciation of the circularly polarizing plate using the flat dispersion retardation film. In this specification, the angle formed by an axis of A with respect to an axis of B may mean that both an angle formed by the A axis in a clockwise direction and an angle formed by the A axis in a counterclockwise direction are included based on the B axis at 0 degrees.

The thickness of the retardation film may be, for example, in a range of 10 μm to 100 μm in the case of a polymer stretched film. In another example, the thickness of the retardation film may be, for example, in a range of 0.1 μm to 5 μm in the case of a liquid crystal polymerization film.

The retardation film may be a liquid crystal polymerization film or a polymer stretched film. Specifically, as the retardation film, a stretched polymer layer in which a polymer film capable of imparting optical anisotropy by stretching is stretched in an appropriate manner or a liquid crystal layer can be used. As the liquid crystal layer, a liquid crystal polymer layer or a cured layer of a polymerizable liquid crystal compound can be used.

The liquid crystal polymerization film may comprise a base layer and a liquid crystal layer on one side of the base layer. To the base layer of the liquid crystal polymerization film, the content related to the base layer of the antireflection film may be equally applied. Therefore, the light transmissive base material can also be used as the base layer of the liquid crystal polymerization film. The liquid crystal layer may comprise a polymerizable liquid crystal compound in a polymerized state. In this specification, the term "polymerizable liquid crystal compound" may mean a compound containing a moiety capable of exhibiting liquid crystallinity, such as a mesogen skeleton, and also containing one or more polymerizable functional groups. Such polymerizable liquid crystal compounds are variously known under the so-called RM (reactive mesogen). The polymerizable liquid crystal compound may be contained in the polymerized form in the cured layer, that is, the above-described polymerized unit, which may mean a state where the liquid crystal compound is polymerized to form skeletons of the liquid crystal polymer such as main chains or side chains in the cured layer.

The polymerizable liquid crystal compound may be a monofunctional or multifunctional polymerizable liquid crystal compound. Here, the monofunctional polymerizable liquid crystal compound may be a compound having one polymerizable functional group and the multifunctional polymerizable liquid crystal compound may mean a compound containing two or more polymerizable functional groups. In one example, the polyfunctional polymerizable liquid crystal compound may comprise 2 to 10, 2 to 8, 2 to 6, 2 to 5, 2 to 4, 2 to 3, or 2 or 3 polymerizable functional groups.

It is known that a polymerizable liquid crystal composition prepared by combining such a polymerizable liquid crystal compound with other components such as an initiator, a stabilizer and/or a non-polymerizable liquid crystal compound is cured in a state where it is oriented on an alignment film to form the cured layer expressed with birefingence. The retardation film having flat dispersion characteristics may be produced by including a polymerizable liquid crystal compound having flat dispersion characteristics.

As the polymer stretched film, for example, a polymer layer comprising, as a polymer material, a polyolefin such as polyethylene or polypropylene, a cycloolefin polymer (COP) such as polynorbornene, polyvinyl chloride, polyacrylonitrile, polysulfone, an acrylic resin, polycarbonate, a polyester such as polyethylene terephthalate, a polyacrylate, polyvinyl alcohol or a cellulose ester polymer such as TAC (triacetyl cellulose), or a copolymer of two or more monomers among the monomers forming the polymers, and the like can be used.

A method for obtaining a polymer stretched film is not particularly limited. For example, it can be obtained by molding the polymer material in the form of a film, and then stretching it. The molding method in the form of a film is not particularly limited, but it is possible to be molded into a film by a known method such as injection molding, sheet molding, blow molding, injection blow molding, inflation molding, extrusion molding, foam molding and cast molding, and a secondary processing molding method such as pressure molding and vacuum molding can also be used. Among them, extrusion molding and cast molding are preferably used. At this time, an unstretched film can be extruded and molded by using, for example, an extruder equipped with a T-die, a circular die or the like. When a molded product is obtained by extrusion molding, a previously melt-kneaded material of various resin components, additives, and the like may also be used, and the molded product may also be molded via melt-kneading at the time of extrusion molding. The unstretched film may also be cast-molded by dissolving various resin components with a solvent common to various resin components, for example, a solvent such as chloroform and methylene dichloride, and then casting, drying and solidifying them.

In the polymer stretched film, the molded film may be uniaxially stretched in a mechanical direction (MD, longitudinal direction or length direction) and uniaxially stretched a direction going straight to the mechanical direction (TD; transverse direction, cross direction or width direction), and a biaxially stretched film may also be produced by stretching it by a sequential biaxial stretching method of roll stretching and tenter stretching, a simultaneous biaxial stretching method by tenter stretching, a biaxial stretching method by tubular stretching, etc.

The control of the retardation value in the polymer stretched film can generally be performed by controlling stretching conditions of the film. This is because the retardation value is caused by the thickness of the film itself due to the stretching of the film. In the case of biaxial stretching, the ratio (MD direction/TD direction) of draw ratios in the mechanical direction (MD direction) and the direction (TD direction) going straight to the mechanical direction is preferably 0.67 or less or 1.5 or more, more preferably 0.55 or less or 1.8 or more, and most preferably 0.5 or less or 2 or more.

The pressure-sensitive adhesive layer may perform a function of attaching the circularly polarizing plate to the display panel. The pressure-sensitive adhesive layer may comprise a pressure-sensitive adhesive resin. As the pressure-sensitive adhesive resin, for example, a light transmissive pressure-sensitive adhesive resin can be used. For example, a pressure-sensitive adhesive resin can be used such that the transmittance of the pressure-sensitive adhesive layer formed by the pressure-sensitive adhesive resin for light having a wavelength of 380 nm to 780 nm is about 80% or more, 85% or more, 90% or more, or 95% or more. The transmittance may mean a percentage of a light quantity transmitted through the pressure-sensitive adhesive layer to a light quantity incident on the pressure-sensitive adhesive layer. The pressure-sensitive adhesive resin may comprise, for example, one or more selected from the group consisting of an acrylic resin, a silicone-based resin, an ester-based resin, a urethane-based resin, an amide-based resin, an ether-based resin, a fluorine-based resin and a rubber-based resin.

The thickness of the pressure-sensitive adhesive layer may be, for example, in a range of 15 μm to 30 μm.

The method of forming a pressure-sensitive adhesive layer on one side of a retardation film is not particularly limited. In one example, it may be performed by a process of applying a pressure-sensitive adhesive composition comprising the pressure-sensitive adhesive resin to a release film to form a pressure-sensitive adhesive layer, and then transferring the pressure-sensitive adhesive layer to one side of a retardation film and removing the release film. In another example, the pressure-sensitive adhesive layer may be formed by applying a pressure-sensitive adhesive composition directly to one side of the retardation film.

The circularly polarizing plate may have transmittance of 50% or less or 45% or less for light having a wavelength of 430 nm. The lower limit of the transmittance of the circularly polarizing plate for light having a wavelength of 430 nm may be, for example, 20% or more.

The circularly polarizing plate may further comprise a dye. The dye functions to control the transmittance of the circularly polarizing plate. In this specification, the dye may mean a material capable of intensively absorbing and/or modifying light in at least part or the entire range within a visible light region, for example, a wavelength range of 380 nm to 780 nm.

The circularly polarizing plate comprising the dye may have transmittance of 40% or less or 35% or less for light having a wavelength of 430 nm. Since the circularly polarizing plate can contribute to neutral reflection colors by satisfying such a transmittance range, it may be more advantageous to improve the reflective visual appreciation even when using a retardation film having flat dispersion characteristics. More specifically, the circularly polarizing plate comprising the dye may have transmittance of 35% or more or 40% or more for light having wavelengths of 460 nm and 550 nm, respectively, and the upper limits thereof may be 50% or less or 45% or less, respectively.

The lower limit of the transmittance of the circularly polarizing plate comprising the dye for light having a wavelength of 430 nm may be 4% or more, 10% or more, 15% or more, or 20% or more. When the transmittance is too low, the color change of the white light emitted from an OLED becomes too large, so that it is preferable that the lower limit of the transmittance in the pressure-sensitive adhesive layer comprising the dye is in the above range.

The dye may be appropriately selected within a range that the circularly polarizing plate can exhibit the transmittance characteristics. The dye may be, for example, a dye exhibiting absorption in the blue region. The dye may exhibit maximum absorbance in the blue region. The absorbancy or absorbance of the dye herein may be determined from the transmission spectrum measured for the layer formed by mixing the dye with the light transmissive resin. In this specification, the light transmissive resin may mean a layer that the transmittance for light having a wavelength of 380 nm to 780 nm measured with respect to the layer formed by the resin alone is about 80% or more, 85% or more, 90% or more, or 95% or more.

The dye having such absorption characteristics may be abbreviated herein as a blue cut dye. The blue region may be, for example, in the wavelength range of 370 nm to 430 nm. Therefore, the circularly polarizing plate comprising the dye may also exhibit a maximum absorbance within the range of 370 nm to 430 nm of the wavelength range of 380 nm to 780 nm. The dye absorbs the blue region, and thus may exhibit a yellow color sense. The dye may also be a single dye or a mixture of two or more dyes within a range that the circularly polarizing plate exhibits the transmittance characteristics.

As the dye, one or more dyes selected from the group consisting of an anthraquinone-based dye, a methane-based dye, an azomethine-based dye, an oxazine-based dye, an azo-based dye, a styryl-based dye, a coumarin-based dye, a porphyrin-based dye, a dibenzofuranone-based dye, a diketopyrrolophyrrole-based dye, a rhodamine-based dye, a xanthene-based dyes and a pyrromethene-based dye may be used.

The dye may be included in any layer included in the circularly polarizing plate within a range that the circularly polarizing plate can exhibit the transmittance.

For example, the dye may be included in one or more of the antireflection film, the retardation film and the pressure-sensitive adhesive layer. In one example, the dye may be included in the antireflection film. As described above, the antireflection film may comprise a base layer and a low refractive layer on one side of the base layer. In this case, the dye may be included in the base layer of the antireflection film. Alternatively, as described above, the antireflection film may further comprise a hard coating layer between the base layer and the low refractive layer. In this case, the dye may also be included in the hard coating layer of the antireflection film. In one example, the dye may be included in the retardation film. As described above, when the retardation film is a liquid crystal polymerization film, the retardation film may comprise a base layer and a liquid crystal layer on one side of the base layer. In this case, the dye may be included in the base layer of the retardation film. On the other hand, when the retardation film is a polymer stretched film, the dye may be included in the polymer stretched film. In one example, the dye may also be included in the pressure-sensitive adhesive layer.

In another example, the circularly polarizing plate may also further comprise a separate layer for use to comprise the dye, in addition to the antireflection film, the retardation film and the pressure-sensitive adhesive layer. Such a separate layer may also comprise the dye, while comprising a light transmissive resin as a main component. The position of the separate layer is not particularly limited, and it may be formed on one side or both sides of the antireflection film, the polarizer, the retardation film or the pressure-sensitive adhesive layer. However, the pressure-sensitive adhesive layer is used for attaching the circularly polarizing plate to the panel, so that it may be preferable that the separate layer does not exist on the panel attachment surface of the pressure-sensitive adhesive layer.

The layer comprising the dye may have transmittance of less than 100%, 95% or less, 90% or less, 85% or less, 80% or less, 75% or less, or 70% or less for light having a wavelength of 430 nm. Since the layer comprising the dye can contribute to neutral reflection colors by satisfying this transmittance range, it may be more advantageous to improve reflective visual appreciation even when using a retardation film having flat dispersion characteristics. More specifically, the layer comprising the dye may have transmittance of 90% or more for light having wavelengths of 460 nm and 550 nm, respectively. The lower limit of transmittance of the layer comprising the dye for light having a wavelength of 430 nm may be 10% or more. When the transmittance is too low, the color change of the white light emitted from an OLED becomes too large, so that it is preferable that the lower limit of the transmittance in the layer comprising the dye is in the above range.

The content of the dye in the layer comprising the dye may be appropriately selected within a range that allows the circularly polarizing plate to exhibit the transmittance characteristics. As described above, the layer comprising the dye may comprise a light transmissive resin as a main component, and may further comprise the dye. The content of the dye in the layer containing the dye may be, for example, 10 parts by weight or less relative to 100 parts by weight of the light transmissive resin. As the content of the dye in the layer comprising the dye increases, it may be closer to the desired reflection color. However, when the content of the dye is too high, precipitation may also occur due to insufficient solubility of the dye and affect the physical properties of each layer, so that it may be preferable to be controlled within the above range. Specifically, the content of the dye in the layer comprising the dye may be 8 parts by weight or less, 6 parts by weight or less, 4 parts by weight or less, 2 parts by weight or less, or 1 part by weight or less relative to 100 parts by weight of the light transmissive resin. The lower limit of the content of the dye in the layer comprising the dye is not particularly limited, but in order to effectively show the effect of improving the reflective visual appreciation due to the addition of the dye, it may be included in an amount of, for example, 0.01 parts by weight or more or 0.1 parts by weight or more, relative to 100 parts by weight of the light transmissive resin.

If the weight of the dye in the layer comprising the dye is the same, the same transmittance characteristics can be obtained by changing the thickness of the layer comprising the dye. Therefore, when the transmittance of the layer comprising the dye is intended to increase within the above-mentioned range, there is a method that the thickness of the layer comprising the dye is fixed and the weight of the dye is reduced to lower the concentration of the dye, or the thickness of the layer comprising the dye, in which the concentration of the dye is the same, is lowered to reduce the weight of the dye.

The present application also relates to a display device comprising the circularly polarizing plate. As the display device, an OLED (organic light-emitting diode) device may be exemplified.

FIG. 3 illustratively shows an OLED device of the present application. As shown in FIG. 3, the OLED device may comprise an OLED panel (200) and a circularly polarizing plate (100) disposed on one side of the OLED panel. The OLED panel and the circularly polarizing plate may be attached via a pressure-sensitive adhesive layer (40).

The OLED panel may comprise a substrate, a lower electrode, an organic light-emitting layer and an upper electrode sequentially. The organic light-emitting layer may comprise an organic material that can emit light when a voltage has been applied to the lower electrode and the upper electrode. One of the lower electrode and the upper electrode may be a positive electrode (anode) and the other may be a negative electrode (cathode). The positive electrode is an electrode into which holes are injected, which may be made of a conductive material having a high work function, and the negative electrode is an electrode into which electrons are injected, which may be made of a conductive material having a low work function. In general, a transparent metal oxide layer, such as ITO or IZO, having a large work function may be used as the positive electrode, and a metal electrode having a low work function may be used as the negative electrode. In general, the organic light-emitting layer is transparent, and thus a transparent display can be realized when the upper and lower electrodes are made transparent. In one example, when the thickness of the metal electrode is made very thin, a transparent display can be realized.

The OLED panel may further comprise an encapsulation substrate, which functions to prevent inflow of moisture and/or oxygen from the outside, on the upper electrode. It may further comprise auxiliary layers between the lower electrode and the organic light-emitting layer and between the upper electrode and the organic light-emitting layer. The auxiliary layer may include a hole transporting layer, a hole injecting layer, an electron injecting layer, and an electron transporting layer, for balancing electrons and holes, but is not limited thereto.

The circularly polarizing plate may be disposed on the side where the light comes out from the OLED element. For example, in the case of a bottom emission structure in which light is emitted toward the base substrate, it may be disposed outside the base substrate, and in the case of a top emission structure in which light is emitted toward the encapsulation substrate, it may be disposed outside the encapsulation substrate. The circularly polarizing plate can improve visibility and display performance by preventing external light from being reflected by a reflective layer made of metal such as electrodes and wiring of the OLED panel and from coming out of the OLED panel.

In one example, the OLED panel may further comprise a substrate on which a color filter is formed. The substrate on which the color filter is formed may be disposed on the opposite side of the OLED panel on which the metal electrode is disposed. At this time, the OLED panel may have a structure that sequentially comprises a substrate on which a color filter is formed, a transparent metal oxide electrode (positive electrode), a light-emitting layer, a metal electrode (negative electrode) and a base substrate. The color filter may comprise red, green, and blue regions, and may further comprise a black matrix for dividing the regions. The case where the color filter is present on the substrate of the OLED panel may exhibit low reflectance as compared to the case where the color filter is not present. Specifically, when the red, green, and blue color filters are positioned in front of the light-emitting layer of the OLED, it is because the high reflectance at the metal electrode located on the back side of the light-emitting layer is reduced.

The OLED panel may be a low reflection OLED panel having average reflectance of 25% or less for light having a wavelength in the range of 400 nm to 600 nm. In the OLED panel, the lower limit of the average reflectance for light having a wavelength in the range of 400 nm to 600 nm may be, for example, 10% or more. The OLED panel has average reflectance of 25% or less for light having a wavelength in a range of 500 nm to 600 nm. The OLED panel may have average reflectance of, for example, 35% or less for light having a wavelength within the range of 600 nm to 650 nm. In the OLED panel, the lower limit of the average reflectance for light having a wavelength in the range of 600 nm to 650 nm may be, for example 10% or more. Through the application of such an OLED panel, it may be more advantageous to improve the reflective visual appreciation while using a retardation film having flat dispersion characteristics.

As described above, an OLED device in which the circularly polarizing plate of the present application is applied to an OLED panel may exhibit excellent reflective visual appreciation. In one example, the OLED panel, to which the circularly polarizing plate is attached, may have reflectance of 2.1% or less for light having a wavelength of 550 nm. The reflectance may be specifically 2.0% or less, 1.9% or less, 1.8% or less, 1.7% or less, 1.6% or less, 1.5% or less, 1.4% or less, 1.3% or less, 1.2% or less, 1.1% or less, or 1.0% or less. It means that the lower the reflectance of the OLED panel to which the circularly polarizing plate is attached, the better the reflective visual appreciation, and thus the lower limit is not particularly limited, but may be, for example, 0.1% or more.

In one example, the reflection colors of the OLED panel to which the circularly polarizing plate is attached may satisfy Equation 3 or Equation 4 below based on L*a*b* color coordinates. The circularly polarizing plate may satisfy any one of Equation 3 or 4, or both.

$$\sqrt{a^{*2}+b^{*2}} < 8 \qquad \text{[Equation 3]}$$

$$0 < a^* < 8 \text{ and } -8 < b^* < 0. \qquad \text{[Equation 4]}$$

When the reflectance and the reflection colors of the OLED panel, to which the circularly polarizing plate is attached, satisfy the above conditions, it can be said that the reflective visual appreciation is excellent. Also, among the a* and b* values, the range of the a* values may be particularly more important, which is because the reflection color sense of red light generally deteriorates viewers' visual appreciation more than blue light. In addition, when the reflectance of the OLED panel for light having a wavelength of 550 nm is in the above range, it may be more advantageous to improve the reflective visual appreciation because they feel blacker even if the absolute values of a* and b* become large.

Advantageous Effects

The present application can provide a circularly polarizing plate which can improve a reflection color sense by using a retardation film having flat dispersion characteristics, and an OLED device comprising the circularly polarizing plate.

BRIEF DESCRIPTION OF DRAWINGS

FIG. 1 illustratively shows a circularly polarizing plate of the present application.

FIGS. 2(a) and 2(b) illustratively show reflectance spectra of antireflection films.

FIG. 3 illustratively shows an OLED device of the present application.

FIG. 4 is reflectance spectra of antireflection films.

FIG. 5 is transmittance spectra of pressure-sensitive adhesive layers comprising a blue cut dye.

FIG. 6 is transmittance spectra according to application of pressure-sensitive adhesive layers comprising a blue cut dye to a polarizer.

FIG. 7 is a reflectance spectrum of a reflective plate.

Hereinafter, the present application will be described in detail through examples complying with the present application and comparative examples not complying with the present application, but the scope of the present application is not limited to the following examples.

Circularly Polarizing Plate

A circularly polarizing plate comprising an antireflection film, a polarizer, a retardation film and an adhesive layer sequentially was prepared.

The antireflection film was produced by coating a hard coating layer having a thickness of about 5 μm on a triacetyl cellulose (TAC) base film and then coating a low refractive layer including hollow silica nanoparticles on the hard coating layer. The low refractive layer has a refractive index of about 1.32 for light having a wavelength of 550 nm. The thickness of the low refractive layer is controlled in a range of about 80 nm to 200 nm, and the lowest reflection wavelength of the antireflection film can be adjusted by controlling the thickness of the low refractive layer. Specifically, the lowest reflection wavelength of the antireflection film shifts to longer wavelengths as the thickness of the low refractive layer becomes thicker, and shifts to short wavelengths as the thickness of the low refractive layer becomes thinner. As the lowest reflection wavelength of the antireflection film increases, the b* of the reflection colors of the antireflection film tends to decrease. By adjusting the thickness within the thickness range, six types of antireflection films were prepared as shown in Table 1 below.

The retardation film was a product produced by obliquely stretching a COP film from Zeon, where products that the R(450)/R(550) value was 1 and the in-plane retardation values for light having a wavelength of 550 nm were 130 nm, 135 nm, and 137.5 nm, 140 nm, 142 nm and 144 nm, respectively, were prepared. In addition, the angle formed by the slow axis of the retardation film and the light absorption axis of the polarizer was adjusted to be 45 degrees or 40 degrees. The retardation value and optical axis of the retardation film are determined using Axometrics' Axoscan equipment.

As the polarizer, a PVA-based polarizer having transmittance of 44% was used. The transmittance and absorption axis of the polarizer are determined using Jasco's V-7100 Spectrophotometer equipment.

The pressure-sensitive adhesive layer is laminated on the retardation film surface by using a product coated between release films. As the pressure-sensitive adhesive layer, a commercially available acrylic pressure-sensitive adhesive for polarizing plates is used. As the pressure-sensitive adhesive, a pressure-sensitive adhesive comprising no blue cut dye and a pressure-sensitive adhesive comprising a blue cut dye (Eutec Chemical Co., Ltd.'s Eusorb UV-1990) were prepared. The thickness of the adhesive is 20 μm. The blue cut dye in the pressure-sensitive adhesive was mixed to have concentrations of about 0.3%, 0.6% and 0.9% to prepare the pressure-sensitive adhesive comprising the blue cut dye. The transmittance spectrum of the pressure-sensitive adhesive layer comprising the blue cut dye was specifically described in Evaluation Example 2 below.

EVALUATION EXAMPLE 1

Evaluation of Surface Reflection Characteristics in Antireflection Films

For antireflection films, reflection colors and reflectance were measured to evaluate surface reflection characteristics. Table 1 shows results of measuring lowest reflection wavelengths, reflection colors (L*a*b* color coordinates) and reflectance in the antireflection films.

The reflectance of the antireflection film was measured by attaching a black tape absorbing light to the backside of the antireflective coating layer of the base material and then using Minolta's CM-2600d equipment to measure mirror reflectance of the surface layer of the antireflective coating layer. Specifically, the reflectance is a result value of subtracting the SCE (Specular component excluded) value from the SCI (Specular component included) value among the measured values of the equipment. Simultaneously with the above measurements, CIE 1976 L*a*b* under a D65 light source condition can be obtained from the measurement equipment. Since most of the SCE values were values reflected from the black tape attached to the backside instead of the antireflection film, the SCE values were subtracted to accurately determine the reflection characteristics of the antireflection film.

FIG. 4 shows reflectance spectra of the antireflection films AR1 to AR6, and Table 1 shows the L*a*b* color coordinates of reflection colors of the antireflection film, luminous reflectance (Y) and reflectance for light having a wavelength of 550 nm.

| Anti-reflection film | Low refractive layer thickness | Lowest reflection wavelength | Reflection color (D65, CIE 1976 L*a*b*) | | | Reflectance | 550 nm |
|---|---|---|---|---|---|---|---|
| | | | L* | a* | b* | Y | |
| AR1 | 73 nm | 380 nm | 11.53 | 2.22 | 7.80 | 1.3% | 1.3% |
| AR2 | 84 nm | 440 nm | 8.27 | 3.39 | 5.04 | 0.9% | 0.9% |
| AR3 | 90 nm | 470 nm | 7.66 | 3.94 | 3.25 | 0.8% | 0.8% |
| AR4 | 105 nm | 550 nm | 5.72 | 3.57 | −5.46 | 0.6% | 0.6% |
| AR5 | 113 nm | 590 nm | 7.80 | 2.50 | −10.48 | 0.9% | 0.8% |
| AR6 | 120 nm | 630 nm | 8.61 | 1.84 | −11.23 | 1.0% | 0.9% |

EVALUATION EXAMPLE 2

Evaluation of Transmittance of Pressure-Sensitive Adhesive and Polarizing Plate

The transmittance of the pressure-sensitive adhesive comprising the blue cut dye and the transmittance of the polarizer before and after the attachment of the pressure-sensitive adhesive were measured, and the results are shown in FIGS. 5 and 6, respectively. The pressure-sensitive adhesive with a blue cut dye concentration of 0.3% has transmittance of 90% for a wavelength of 430 nm, the pressure-sensitive adhesive with a blue cut dye concentration of 0.6% has transmittance of 80% for a wavelength of 430 nm, and the pressure-sensitive adhesive with a blue cut dye concentration of 0.9% has transmittance of 70% for a wavelength of 430 nm.

The transmittance of the pressure-sensitive adhesive comprising the blue cut dye was measured using Shimadzu UV-3600. Specifically, it was measured using a sample that the pressure-sensitive adhesive comprising the blue cut dye was attached to a glass substrate, and then a transparent PET film was attached to the exposed pressure-sensitive adhesive surface again. Upon setting the baseline of the equipment before the measurement of the sample, it was performed in a state of loading a sample having the same structure as the measurement sample and introducing a transparent pressure-sensitive adhesive instead of the pressure-sensitive adhesive comprising the blue cut dye. As a result, the measured transmittance of the sample was measured under the condition that the reflectance was not included, whereby the transmittance of the wavelength band without absorption of the dye is 100%. The transmission colors of the pressure-sensitive adhesive were calculated using the transmission data for each wavelength obtained using the Shimadzu UV-3600 equipment.

The transmittance of the polarizer was measured using Jasco's V-7100 Spectrophotometer. The transmittance and transmission color measurement results were described in Table 2 below.

TABLE 2

| | | Transmittance | | Transmission color (D65, CIE 1976 L*a*b*) | | |
|---|---|---|---|---|---|---|
| | | Y | 430 nm | L* | a* | b* |
| PSA1 | Pressure-sensitive adhesive 1 (0.3%) | 99.9% | 90% | 99.97 | −1.62 | 2.88 |
| PSA2 | Pressure-sensitive adhesive 2 (0.6%) | 99.8% | 80% | 99.93 | −3.00 | 5.41 |
| PSA3 | Pressure-sensitive adhesive 3 (0.9%) | 99.7% | 70% | 99.90 | −4.14 | 7.57 |
| POL1 | Polarizer | 44.1% | 40.6% | 72.28 | −0.87 | 2.53 |
| POL2 | Polarizer + Pressure-sensitive adhesive 1 | 44.0% | 36.5% | 72.26 | −1.96 | 4.54 |
| POL3 | Polarizer + Pressure-sensitive adhesive 2 | 44.0% | 32.3% | 72.24 | −2.92 | 6.34 |
| POL4 | Polarizer + Pressure-sensitive adhesive 3 | 44.0% | 28.4% | 72.21 | −3.71 | 7.89 |

EVALUATION EXAMPLE 3

Evaluation of Reflection Characteristics of Circularly Polarizing Plate

A reflective ND (neutral density) filter with an OD (optical density) of 0.5 coated with Inconel (metal) on one side of a glass substrate purchased from Edmund Optics was used as a reflective plate to measure the reflective characteristics of the circularly polarizing plate. FIG. 7 shows the reflectance spectrum of the reflective plate. The reflectance was measured using Minolta's CM-2600d, and the reflectance was measured on the glass surface with the deposition surface of the reflective plate facing the light trap. The reflectance was obtained from the SCI (specular component included) mode value. The circularly polarizing plate was attached to the glass surface of the reflective plate, and then the reflectance and the reflection colors were measured in the same method as above. The reflectance and reflection colors are measured in the CIE 1964/10° standard under the D65 light source condition. When the reflection colors based on the L*a*b* color coordinates satisfy Δa*b*<8 or 0<a*<8 and −8<b*<0, it can be evaluated as having excellent reflective visual appreciation.

While the constitutions of the circularly polarizing plate were changed, the reflectance and reflection colors were measured, and the measurement results were described in Tables 3 to 6.

Table 3 shows the measurement results of the circularly polarizing plate in which the b* value of the antireflection film and the Rin value of the retardation film for light having a wavelength of 550 nm have been changed with regard to the circularly polarizing plate that the angle formed by the slow axis of the retardation film and the light absorption axis of the polarizer is 45 degrees and the pressure-sensitive adhesive layer comprises no dye, whereby the transmittance of the circularly polarizing plate for light having a wavelength of 430 nm is 40.6%.

Table 4 shows the measurement results of the circularly polarizing plate in which the b* value of the antireflection film and the Rin value of the retardation film for light having a wavelength of 550 nm have been changed with regard to the circularly polarizing plate that the angle formed by the slow axis of the retardation film and the light absorption axis of the polarizer is 40 degrees and the pressure-sensitive adhesive layer comprises no dye, whereby the transmittance of the circularly polarizing plate for light having a wavelength of 430 nm is 40.6%.

Table 5 shows the measurement results of the circularly polarizing plate in which the b* value of the antireflection film and the Rin value of the retardation film for light having a wavelength of 550 nm have been changed with regard to the circularly polarizing plate that the angle formed by the slow axis of the retardation film and the light absorption axis of the polarizer is 45 degrees and the pressure-sensitive adhesive layer comprises the dye in an amount of 0.3 wt %, whereby the transmittance of the circularly polarizing plate for light having a wavelength of 430 nm is 36.5%.

Table 6 shows the measurement results of the circularly polarizing plate in which the b* value of the antireflection film and the Rin value of the retardation film for light having a wavelength of 550 nm have been changed with regard to the circularly polarizing plate that the angle formed by the slow axis of the retardation film and the light absorption axis of the polarizer is 45 degrees and the pressure-sensitive adhesive layer comprises the dye in an amount of 0.6 wt %, whereby the transmittance of the circularly polarizing plate for light having a wavelength of 430 nm is 32.4%.

In Tables 3 to 6, Y(%) means luminous reflectance, R@550 nm means reflectance for light having a wavelength of 550 nm, and $\Delta a^* b^*$ means a value calculated as $\sqrt{a^{*2}+b^{*2}}$. As a result of the evaluation, it can be seen that Examples exhibit excellent reflection colors, as the reflection characteristics satisfy $\Delta a^* b^* < 8$ or $0 < a^* < 8$ and $-8 < b^* < 0$.

TABLE 3

| | | Structure of circularly polarizing plate | | Reflection characteristics | | | | |
|---|---|---|---|---|---|---|---|---|
| | | Antireflection film b* | Retardation film Rin (nm) | Y (%) | R @ 550 nm | a* | b* | Δa*b* |
| Example | 1 | 7.80 | 130 | 1.48 | 1.24 | 5.35 | 4.58 | 7.0 |
| | 2 | 5.04 | 130 | 1.06 | 0.84 | 7.05 | 2.03 | 7.3 |
| | 3 | 3.25 | 130 | 0.99 | 0.77 | 7.68 | 0.35 | 7.7 |
| Comparative Example | 1 | −5.46 | 130 | 0.77 | 0.55 | 8.30 | −7.54 | 11.2 |
| | 2 | −10.48 | 130 | 1.01 | 0.73 | 6.42 | −11.44 | 13.1 |
| | 3 | −11.23 | 130 | 1.10 | 0.81 | 5.65 | −12.09 | 13.3 |
| Example | 4 | 7.80 | 135 | 1.45 | 1.20 | 5.12 | 2.07 | 5.5 |
| | 5 | 7.80 | 135 | 1.03 | 0.81 | 6.80 | −0.82 | 6.9 |
| | 6 | 5.04 | 135 | 0.96 | 0.73 | 7.44 | −2.44 | 7.8 |
| Comparative Example | 4 | 3.25 | 135 | 0.75 | 0.52 | 7.94 | −9.93 | 12.7 |
| | 5 | −5.46 | 135 | 0.96 | 0.70 | 6.15 | −13.32 | 14.7 |
| | 6 | −10.48 | 135 | 1.07 | 0.78 | 5.38 | −13.86 | 14.9 |
| Example | 7 | 7.80 | 137.5 | 1.45 | 1.19 | 4.93 | 0.87 | 5.0 |
| | 8 | 5.04 | 137.5 | 1.03 | 0.80 | 6.58 | −2.14 | 6.9 |
| | 9 | 3.25 | 137.5 | 0.96 | 0.73 | 7.21 | −3.72 | 8.1 |
| Comparative Example | 7 | −5.46 | 137.5 | 0.75 | 0.51 | 7.68 | −11.01 | 13.4 |
| | 8 | −10.48 | 137.5 | 0.98 | 0.70 | 5.92 | −14.16 | 15.3 |
| | 9 | −11.23 | 137.5 | 1.07 | 0.78 | 5.15 | −14.64 | 15.5 |
| Example | 10 | 7.80 | 140 | 1.46 | 1.20 | 4.71 | −0.27 | 4.7 |
| | 11 | 5.04 | 140 | 1.04 | 0.81 | 6.29 | −3.38 | 7.1 |
| | 12 | 3.25 | 140 | 0.97 | 0.73 | 6.91 | −4.91 | 8.5 |
| Comparative Example | 10 | −5.46 | 140 | 0.76 | 0.52 | 7.36 | −12.00 | 14.1 |
| | 11 | −10.48 | 140 | 0.99 | 0.70 | 5.63 | −14.92 | 15.9 |
| | 12 | −11.23 | 140 | 1.08 | 0.78 | 4.88 | −15.35 | 16.1 |
| Example | 13 | 7.80 | 142 | 1.47 | 1.20 | 4.50 | −1.13 | 4.6 |
| | 14 | 5.04 | 142 | 1.06 | 0.82 | 6.02 | −4.29 | 7.4 |
| | 15 | 3.25 | 142 | 0.99 | 0.74 | 6.62 | −5.79 | 8.8 |
| Comparative Example | 13 | −5.46 | 142 | 0.77 | 0.52 | 7.08 | −12.72 | 14.6 |
| | 14 | −10.48 | 142 | 1.00 | 0.71 | 5.35 | −15.46 | 16.4 |
| | 15 | −11.23 | 142 | 1.09 | 0.79 | 4.62 | −15.87 | 16.5 |
| Example | 16 | 7.80 | 144 | 1.49 | 1.22 | 4.26 | −1.94 | 4.7 |
| | 17 | 5.04 | 144 | 1.07 | 0.83 | 5.72 | −5.13 | 7.7 |
| | 18 | 3.25 | 144 | 1.01 | 0.76 | 6.30 | −6.60 | 9.1 |
| Comparative Example | 16 | −5.46 | 144 | 0.79 | 0.54 | 6.75 | −13.37 | 15.0 |
| | 17 | −10.48 | 144 | 1.02 | 0.72 | 5.04 | −15.94 | 16.7 |
| | 18 | −11.23 | 144 | 1.11 | 0.80 | 4.33 | −16.32 | 16.9 |

TABLE 4

| | | Structure of circularly polarizing plate | | Reflection characteristics | | | | |
|---|---|---|---|---|---|---|---|---|
| | | Antireflection film b* | Retardation film Rin (nm) | Y (%) | R @ 550 nm | a* | b* | Δa*b* |
| Example | 19 | 7.80 | 130 | 1.63 | 1.36 | 4.90 | 4.55 | 6.7 |
| | 20 | 5.04 | 130 | 1.21 | 0.97 | 6.34 | 2.18 | 6.7 |
| | 21 | 3.25 | 130 | 1.14 | 0.90 | 6.89 | 0.64 | 6.9 |
| Comparative Example | 19 | −5.46 | 130 | 0.92 | 0.68 | 7.46 | −6.68 | 10.0 |
| | 20 | −10.48 | 130 | 1.15 | 0.87 | 5.73 | −10.51 | 12.0 |
| | 21 | −11.23 | 130 | 1.24 | 0.95 | 5.05 | −11.20 | 12.3 |

TABLE 4-continued

|  |  | Structure of circularly polarizing plate | | Reflection characteristics | | | | |
|---|---|---|---|---|---|---|---|---|
|  |  | Antireflection film b* | Retardation film Rin (nm) | Y (%) | R @ 550 nm | a* | b* | Δa*b* |
| Example | 22 | 7.80 | 135 | 1.60 | 1.33 | 4.68 | 2.26 | 5.2 |
|  | 23 | 7.80 | 135 | 1.18 | 0.94 | 6.11 | −0.39 | 6.1 |
|  | 24 | 5.04 | 135 | 1.11 | 0.87 | 6.65 | −1.88 | 6.9 |
| Comparative | 22 | 3.25 | 135 | 0.90 | 0.65 | 7.21 | −8.90 | 11.5 |
| Example | 23 | −5.46 | 135 | 1.13 | 0.83 | 5.47 | −12.26 | 13.4 |
|  | 24 | −10.48 | 135 | 1.22 | 0.91 | 4.80 | −12.84 | 13.7 |
| Example | 25 | 7.80 | 137.5 | 1.60 | 1.33 | 4.51 | 1.16 | 4.7 |
|  | 26 | 5.04 | 137.5 | 1.18 | 0.94 | 5.90 | −1.59 | 6.1 |
|  | 27 | 3.25 | 137.5 | 1.11 | 0.86 | 6.45 | −3.05 | 7.1 |
| Comparative | 25 | −5.46 | 137.5 | 0.90 | 0.65 | 6.98 | −9.91 | 12.1 |
| Example | 26 | −10.48 | 137.5 | 1.13 | 0.83 | 5.26 | −13.05 | 14.1 |
|  | 27 | −11.23 | 137.5 | 1.22 | 0.91 | 4.60 | −13.58 | 14.3 |
| Example | 28 | 7.80 | 140 | 1.61 | 1.33 | 4.30 | 0.11 | 4.3 |
|  | 29 | 5.04 | 140 | 1.19 | 0.94 | 5.65 | −2.73 | 6.3 |
|  | 30 | 3.25 | 140 | 1.12 | 0.87 | 6.18 | −4.15 | 7.4 |
| Comparative | 28 | −5.46 | 140 | 0.91 | 0.65 | 6.67 | −10.82 | 12.7 |
| Example | 29 | −10.48 | 140 | 1.14 | 0.83 | 5.00 | −13.77 | 14.6 |
|  | 30 | −11.23 | 140 | 1.23 | 0.91 | 4.35 | −14.26 | 14.9 |
| Example | 31 | 7.80 | 142 | 1.62 | 1.34 | 4.11 | −0.69 | 4.2 |
|  | 32 | 5.04 | 142 | 1.20 | 0.95 | 5.41 | −3.58 | 6.5 |
|  | 33 | 3.25 | 142 | 1.13 | 0.88 | 5.93 | −4.97 | 7.7 |
| Comparative | 31 | −5.46 | 142 | 0.92 | 0.66 | 6.38 | −11.49 | 13.1 |
| Example | 32 | −10.48 | 142 | 1.15 | 0.84 | 4.76 | −14.29 | 15.1 |
|  | 33 | −11.23 | 142 | 1.24 | 0.92 | 4.12 | −14.76 | 15.3 |
| Example | 34 | 7.80 | 144 | 1.64 | 1.35 | 3.90 | −1.45 | 4.2 |
|  | 35 | 5.04 | 144 | 1.22 | 0.96 | 5.14 | −4.37 | 6.7 |
|  | 36 | 3.25 | 144 | 1.15 | 0.89 | 5.65 | −5.73 | 8.1 |
| Comparative | 34 | −5.46 | 144 | 0.94 | 0.67 | 6.05 | −12.09 | 13.5 |
| Example | 35 | −10.48 | 144 | 1.17 | 0.86 | 4.49 | −14.76 | 15.4 |
|  | 36 | −11.23 | 144 | 1.26 | 0.94 | 3.86 | −15.21 | 15.7 |

TABLE 5

|  |  | Structure of circularly polarizing plate | | Reflection characteristics | | | | |
|---|---|---|---|---|---|---|---|---|
|  |  | Antireflection film b* | Retardation film Rin (nm) | Y (%) | R @ 550 nm | a* | b* | Δa*b* |
| Example | 37 | 7.80 | 130 | 1.48 | 1.23 | 4.91 | 5.72 | 7.5 |
|  | 38 | 5.04 | 130 | 1.06 | 0.84 | 6.52 | 3.30 | 7.3 |
|  | 39 | 3.25 | 130 | 0.99 | 0.77 | 7.14 | 1.60 | 7.3 |
| Comparative | 37 | −5.46 | 130 | 0.77 | 0.55 | 7.66 | −6.54 | 10.1 |
| Example | 38 | −10.48 | 130 | 1.00 | 0.73 | 5.87 | −10.71 | 12.2 |
|  | 39 | −11.23 | 130 | 1.09 | 0.81 | 5.11 | −11.41 | 12.5 |
| Example | 40 | 7.80 | 135 | 1.45 | 1.20 | 4.49 | 3.52 | 5.7 |
|  | 41 | 7.80 | 135 | 1.03 | 0.81 | 6.05 | 0.80 | 6.1 |
|  | 42 | 5.04 | 135 | 0.96 | 0.73 | 6.66 | −0.87 | 6.7 |
| Comparative | 40 | 3.25 | 135 | 0.75 | 0.52 | 7.03 | −8.64 | 11.1 |
| Example | 41 | −5.46 | 135 | 0.98 | 0.70 | 5.36 | −12.35 | 13.5 |
|  | 42 | −10.48 | 135 | 1.07 | 0.78 | 4.62 | −12.95 | 13.7 |
| Example | 43 | 7.80 | 137.5 | 1.45 | 1.19 | 4.21 | 2.47 | 4.9 |
|  | 44 | 5.04 | 137.5 | 1.03 | 0.80 | 5.70 | −0.38 | 5.7 |
|  | 45 | 3.25 | 137.5 | 0.96 | 0.73 | 6.31 | −2.01 | 6.6 |
| Comparative | 43 | −5.46 | 137.5 | 0.75 | 0.51 | 6.62 | −9.59 | 11.7 |
| Example | 44 | −10.48 | 137.5 | 0.98 | 0.70 | 5.00 | −13.07 | 14.0 |
|  | 45 | −11.23 | 137.5 | 1.07 | 0.78 | 4.27 | −13.62 | 14.3 |
| Example | 46 | 7.80 | 140 | 1.46 | 1.20 | 3.88 | 1.48 | 4.1 |
|  | 47 | 5.04 | 140 | 1.04 | 0.81 | 5.30 | −1.47 | 5.5 |
|  | 48 | 3.25 | 140 | 0.97 | 0.73 | 5.88 | −3.06 | 6.6 |
| Comparative | 46 | −5.46 | 140 | 0.75 | 0.52 | 6.16 | −10.44 | 12.1 |
| Example | 47 | −10.48 | 140 | 0.98 | 0.70 | 4.58 | −13.70 | 14.4 |
|  | 48 | −11.23 | 140 | 1.08 | 0.78 | 3.87 | −14.21 | 14.7 |
| Example | 49 | 7.80 | 142 | 1.47 | 1.20 | 3.58 | 0.72 | 3.7 |
|  | 50 | 5.04 | 142 | 1.05 | 0.82 | 4.92 | −2.28 | 5.4 |
|  | 51 | 3.25 | 142 | 0.98 | 0.74 | 5.49 | −3.83 | 6.7 |
| Comparative | 49 | −5.46 | 142 | 0.77 | 0.52 | 5.75 | −11.05 | 12.5 |
| Example | 50 | −10.48 | 142 | 1.00 | 0.71 | 4.19 | −14.15 | 14.8 |
|  | 51 | −11.23 | 142 | 1.09 | 0.79 | 3.51 | −14.63 | 15.0 |

TABLE 5-continued

| | | Structure of circularly polarizing plate | | Reflection characteristics | | | | |
|---|---|---|---|---|---|---|---|---|
| | | Antireflection film b* | Retardation film Rin (nm) | Y (%) | R @ 550 nm | a* | b* | Δa*b* |
| Example | 52 | 7.80 | 144 | 1.49 | 1.22 | 3.26 | 0.01 | 3.3 |
| | 53 | 5.04 | 144 | 1.07 | 0.83 | 4.52 | −3.02 | 5.4 |
| | 54 | 3.25 | 144 | 1.00 | 0.76 | 5.06 | −4.54 | 6.8 |
| Comparative Example | 52 | −5.46 | 144 | 0.78 | 0.54 | 5.31 | −11.60 | 12.8 |
| | 53 | −10.48 | 144 | 1.02 | 0.72 | 3.78 | −14.54 | 15.0 |
| | 54 | −11.23 | 144 | 1.11 | 0.80 | 3.12 | −15.00 | 15.3 |

TABLE 6

| | | Structure of circularly polarizing plate | | Reflection characteristics | | | | |
|---|---|---|---|---|---|---|---|---|
| | | Antireflection film b* | Retardation film Rin (nm) | Y (%) | R @ 550 nm | a* | b* | Δa*b* |
| Example | 55 | 7.80 | 130 | 1.48 | 1.23 | 4.91 | 5.72 | 7.5 |
| | 56 | 5.04 | 130 | 1.06 | 0.84 | 6.52 | 3.30 | 7.3 |
| | 57 | 3.25 | 130 | 0.99 | 0.77 | 7.14 | 1.60 | 7.3 |
| Comparative Example | 55 | −5.46 | 130 | 0.77 | 0.55 | 7.66 | −6.54 | 10.1 |
| | 56 | −10.48 | 130 | 1.00 | 0.73 | 5.87 | −10.71 | 12.2 |
| | 57 | −11.23 | 130 | 1.09 | 0.81 | 5.11 | −11.41 | 12.5 |
| Example | 58 | 7.80 | 135 | 1.45 | 1.20 | 4.49 | 3.52 | 5.7 |
| | 59 | 7.80 | 135 | 1.03 | 0.81 | 6.05 | 0.80 | 6.1 |
| | 60 | 5.04 | 135 | 0.96 | 0.73 | 6.66 | −0.87 | 6.7 |
| Comparative Example | 58 | 3.25 | 135 | 0.75 | 0.52 | 7.03 | −8.64 | 11.1 |
| | 59 | −5.46 | 135 | 0.98 | 0.70 | 5.36 | −12.35 | 13.5 |
| | 60 | −10.48 | 135 | 1.07 | 0.78 | 4.62 | −12.95 | 13.7 |
| Example | 61 | 7.80 | 137.5 | 1.45 | 1.19 | 4.21 | 2.47 | 4.9 |
| | 62 | 5.04 | 137.5 | 1.03 | 0.80 | 5.70 | −0.38 | 5.7 |
| | 63 | 3.25 | 137.5 | 0.96 | 0.73 | 6.31 | −2.01 | 6.6 |
| Comparative Example | 61 | −5.46 | 137.5 | 0.75 | 0.51 | 6.62 | −9.59 | 11.7 |
| | 62 | −10.48 | 137.5 | 0.98 | 0.70 | 5.00 | −13.07 | 14.0 |
| | 63 | −11.23 | 137.5 | 1.07 | 0.78 | 4.27 | −13.62 | 14.3 |
| Example | 64 | 7.80 | 140 | 1.46 | 1.20 | 3.88 | 1.48 | 4.1 |
| | 65 | 5.04 | 140 | 1.04 | 0.81 | 5.30 | −1.47 | 5.5 |
| | 66 | 3.25 | 140 | 0.97 | 0.73 | 5.88 | −3.06 | 6.6 |
| Comparative Example | 64 | −5.46 | 140 | 0.75 | 0.52 | 6.16 | −10.44 | 12.1 |
| | 65 | −10.48 | 140 | 0.98 | 0.70 | 4.58 | −13.70 | 14.4 |
| | 66 | −11.23 | 140 | 1.08 | 0.78 | 3.87 | −14.21 | 14.7 |
| Example | 67 | 7.80 | 142 | 1.47 | 1.20 | 3.58 | 0.72 | 3.7 |
| | 68 | 5.04 | 142 | 1.05 | 0.82 | 4.92 | −2.28 | 5.4 |
| | 69 | 3.25 | 142 | 0.98 | 0.74 | 5.49 | −3.83 | 6.7 |
| Comparative Example | 67 | −5.46 | 142 | 0.77 | 0.52 | 5.75 | −11.05 | 12.5 |
| | 68 | −10.48 | 142 | 1.00 | 0.71 | 4.19 | −14.15 | 14.8 |
| | 69 | −11.23 | 142 | 1.09 | 0.79 | 3.51 | −14.63 | 15.0 |
| Example | 70 | 7.80 | 144 | 1.49 | 1.22 | 3.26 | 0.01 | 3.3 |
| | 71 | 5.04 | 144 | 1.07 | 0.83 | 4.52 | −3.02 | 5.4 |
| | 72 | 3.25 | 144 | 1.00 | 0.76 | 5.06 | −4.54 | 6.8 |
| Comparative Example | 70 | −5.46 | 144 | 0.78 | 0.54 | 5.31 | −11.60 | 12.8 |
| | 71 | −10.48 | 144 | 1.02 | 0.72 | 3.78 | −14.54 | 15.0 |
| | 72 | −11.23 | 144 | 1.11 | 0.80 | 3.12 | −15.00 | 15.3 |

EXPLANATION OF REFERENCE NUMERALS

100: circularly polarizing plate, 10: antireflection film, 20: polarizer, 30: retardation film 40: pressure-sensitive adhesive layer, 200: OLED panel

The invention claimed is:

1. A circularly polarizing plate comprising an antireflection film, a polarizer, a retardation film, and a pressure-sensitive adhesive layer sequentially, wherein the retardation film has an R (450)/R (550) value of 0.99 to 1.01, where R(λ) is an in-plane retardation value for a wavelength of λ nm, wherein the antireflection film has reflectance of 2.0% or less for light having a wavelength of 550 nm and reflection colors satisfying b*>0 based on L*a*b* color coordinate, and wherein the circularly polarizing plate has a transmittance of more than 30% for a wavelength of 430 nm.

2. The circularly polarizing plate according to claim 1, wherein a lowest reflection wavelength of the antireflection film is 500 nm or less.

3. The circularly polarizing plate according to claim 1, wherein a lowest reflection wavelength of the antireflection film is 380 nm or more.

4. The circularly polarizing plate according to claim 1, wherein the antireflection film has a lowest reflectance of 1% or less, and one wavelength band having a reflectance of 1% or less at a wavelength in a range of 380 nm to 780 nm.

5. The circularly polarizing plate according to claim 1, wherein the antireflection film has a haze of 1% or less.

6. The circularly polarizing plate according to claim 1, wherein the reflection colors for the antireflection film satisfy a* >0 and L*>0 based on L*a*b* color coordinate.

7. The circularly polarizing plate according to claim 1, wherein the polarizer has a transmittance for light having a wavelength of 550 nm in a range of 40% to 50%.

8. The circularly polarizing plate according to claim 1, wherein the in-plane retardation value of the retardation film for light having a wavelength of 550 nm is in a range of 130 nm to 144 nm.

9. The circularly polarizing plate according to claim 1, wherein an angle formed by a slow axis of the retardation film and an absorption axis of the polarizer is in a range of 35 degrees to 55 degrees.

10. The circularly polarizing plate according to claim 1, wherein the circularly polarizing plate has a transmittance of 40% or more for light having wavelengths of 460 nm and 550 nm, respectively.

11. The circularly polarizing plate according to claim 1, wherein the circularly polarizing plate has a transmittance of 50% or less for light having a wavelength of 430 nm.

12. The circularly polarizing plate according to claim 1, wherein the circularly polarizing plate further comprises a dye exhibiting a maximum absorbance at a wavelength in a range of 370 nm to 430 nm.

13. An OLED device comprising an OLED panel and the circularly polarizing plate of claim 1 disposed on one side of the OLED panel.

14. The OLED device according to claim 13, wherein the OLED panel has an average reflectance of 25% or less for light having a wavelength in a range of 500 nm to 600 nm.

15. The OLED device according to claim 13, wherein the OLED panel, to which the circularly polarizing plate is attached, has a reflectance of 2.1% or less for light having a wavelength of 550 nm.

16. The OLED device according to claim 13, wherein reflection colors of the OLED panel, to which the circularly polarizing plate is attached, satisfy Equation 3 or Equation 4 below based on L*a*b* color coordinates:

$$\sqrt{a^{*2}+b^{*2}}<8 \qquad \text{[Equation 3]}$$

$$0<a^*<8 \text{ and } -8<b^*<0. \qquad \text{[Equation 4]}$$

* * * * *